United States Patent
Xu et al.

(10) Patent No.: US 10,515,986 B2
(45) Date of Patent: Dec. 24, 2019

(54) FLEXIBLE ARRAY SUBSTRATE AND MANUFACTURING METHOD THEREOF, FLEXIBLE DISPLAY PANEL AND DISPLAY APPARATUS

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Yuanjie Xu, Beijing (CN); Yang Wang, Beijing (CN); Tingliang Liu, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 7 days.

(21) Appl. No.: 15/743,458

(22) PCT Filed: Jun. 30, 2017

(86) PCT No.: PCT/CN2017/090979
§ 371 (c)(1),
(2) Date: Jan. 10, 2018

(87) PCT Pub. No.: WO2018/120706
PCT Pub. Date: Jul. 5, 2018

(65) Prior Publication Data
US 2019/0081086 A1 Mar. 14, 2019

(30) Foreign Application Priority Data
Dec. 28, 2016 (CN) .......................... 2016 1 1237973

(51) Int. Cl.
*G02F 1/133* (2006.01)
*H01L 27/12* (2006.01)
(Continued)

(52) U.S. Cl.
CPC .......... *H01L 27/1244* (2013.01); *G09F 9/301* (2013.01); *G09G 3/20* (2013.01); *H01L 27/1218* (2013.01); *H01L 27/1259* (2013.01)

(58) Field of Classification Search
CPC combination set(s) only.
See application file for complete search history.

(56) References Cited

U.S. PATENT DOCUMENTS

2008/0018557 A1* 1/2008 Maeda ..................... G02F 1/167
345/55
2012/0062447 A1* 3/2012 Tseng ................ G02F 1/133305
345/33

(Continued)

FOREIGN PATENT DOCUMENTS

CN 103454821 A 12/2013
CN 103926774 A 7/2014

(Continued)

OTHER PUBLICATIONS

International Search Report and Written Opinion dated Sep. 20, 2017; PCT/CN2017/090979.

(Continued)

*Primary Examiner* — Van N Chow

(57) ABSTRACT

A flexible array substrate and a manufacturing method thereof, a flexible display panel and a display apparatus are provided. The flexible array substrate includes: a flexible base substrate; and a plurality of signal lines on the flexible base substrate, comprising: a plurality of first signal lines and a plurality of second signal lines, intersected to each other to form a plurality of pixel regions arranged in an (Continued)

array, wherein each of the signal lines has at least one straight line segment, the at least one straight line segment and a first direction form a preset included angle, the first direction is a direction where a long edge of the flexible array substrate is positioned, and the preset included angle is not equal to zero or a right angle.

20 Claims, 11 Drawing Sheets

(51) Int. Cl.
*G09F 9/30* (2006.01)
*G09G 3/20* (2006.01)

(56) References Cited

U.S. PATENT DOCUMENTS

2014/0055702 A1  2/2014  Park et al.
2016/0284262 A1  9/2016  Qin et al.
2016/0307528 A1  10/2016 Zou et al.
2017/0336673 A1  11/2017 Jiang et al.

FOREIGN PATENT DOCUMENTS

CN  105137650 A  12/2015
CN  105954938 A  9/2016
CN  106486500 A  3/2017

OTHER PUBLICATIONS

The Chinese Search Report dated May 27, 2017; Appln. No. 201611237973.2.
The First Chinese Office Action dated Aug. 2, 2017; Appln. No. 201611237973.2.
The Second Chinese Office Action dated Oct. 27, 2017; Appln. No. 201611237973.2.

* cited by examiner

FLEXIBLE ARRAY SUBSTRATE AND MANUFACTURING METHOD THEREOF, FLEXIBLE DISPLAY PANEL AND DISPLAY APPARATUS

TECHNICAL FIELD

Embodiments of the present disclosure relate to a flexible array substrate and a manufacturing method thereof, a flexible display panel and a display apparatus.

BACKGROUND

Existing flexible apparatus mainly includes: a Flexible Organic Light Emitting Diode (FOLED) display apparatus, a Flexible Electrophoretic Display (FEPD) display apparatus or a Flexible Liquid Crystal Display (FLCD) display apparatus.

A flexible display panel is a main component of the flexible display apparatus. With reference to FIG. 1, FIG. 1 is a structural schematic diagram of a conventional flexible display panel. The flexible display panel includes: a plurality of sub pixels 01 and a plurality of signal lines. The plurality of signal lines includes gate lines 02 and data lines 03, which are arranged in an intersecting mode, and each sub pixel 01 is positioned in a region surrounded by the gate line 02 and the data line 03 which are arranged in the intersecting mode.

Generally, the flexible display panel can be folded along a direction where a long edge of the flexible display panel is positioned and/or a direction where a short edge of the flexible display panel is positioned, but if an amplitude of folding the flexible display panel is relatively large, a stress applied to the signal line is relatively high and the signal line is easy to break so as to cause line disconnection defect of the flexible display panel.

SUMMARY

An embodiment of the present disclosure provides a flexible array substrate, comprising: a flexible base substrate; and a plurality of signal lines on the flexible base substrate, comprising: a plurality of first signal lines and a plurality of second signal lines, intersected to each other to form a plurality of pixel units arranged in an array, wherein each of the signal lines has at least one straight line segment, the at least one straight line segment and a first direction form a preset included angle, the first direction is a direction where a long edge of the flexible array substrate is positioned, and the preset included angle is not equal to zero or a right angle.

In an example, a shape of the plurality of signal lines includes at least one of a straight line shape, a square wave shape or a sawtooth shape.

In an example, the preset included angle meets a formula that:

$$\sin \alpha = (x*d1)/(y*d2),$$

where the α represents degrees of the preset included angle; the d1 represents a line width of the first signal line; the d2 represents a line width of the second signal line; and x represents a length of a short edge of the flexible array substrate, and y represents a length of the long edge of the flexible array substrate.

In an example, the flexible array substrate includes a display region, and the preset included angle meets a formula that:

$$\sin \alpha = n * \frac{W}{L} * \frac{(\varepsilon 1 * x * d1 * T2)}{(\varepsilon 2 * y * d2 * T1)},$$

where α represents degrees of the preset included angle; n represents a preset adjustment constant; W represents a length of a short edge of the display region; L represents a length of a long edge of the display region; ε1 represents a drawing coefficient of a material the first signal line; ε2 represents a drawing coefficient a material of the second signal line; T1 represents a thickness of the first signal line; T2 represents a thickness of the second signal line; d1 represents a line width of the first signal line; d2 represents a line width of the second signal line; and x represents a length of a short edge of the flexible array substrate, and y represents a length of the long edge of the flexible array substrate.

In an example, the plurality of signal lines includes sawtooth-shaped signal lines, and a stress relief member is arranged at a bent position of the sawtooth-shaped signal line.

In an example, the stress relief member is a sector structure, the sector structure is arranged inside the bent position, and a central angle of the sector structure is equal to a bending angle of the bent position and smaller than 180 degrees.

In an example, the pixel region is a rectangular region, both the first signal line and the second signal line are straight-line-shaped signal lines, the plurality of first signal lines are arranged in parallel, and the plurality of second signal lines are arranged in parallel, wherein an included angle between the first signal line and the first direction is the preset included angle, and an included angle between the second signal line and the first direction is a complementary angle of the preset included angle.

In an example, the pixel region is a rectangular region, the first signal line is a straight-line-shaped signal line, and the plurality of first signal lines are arranged in parallel; and the second signal line is a square-wave-shaped signal line with a rectangular protrusion, and an included between the first direction and one of any two adjacent straight line segments in the second signal line is the preset included angle, and an included angle between the first direction and the other of the any two adjacent straight line segments is a complementary angle of the preset included angle.

In an example, the pixel region is a diamond-shaped region, and the first signal line is a sawtooth-shaped signal line with an isosceles triangular protrusion; the second signal line is a sawtooth-shaped signal line with an isosceles triangular protrusion, and an included between the at least one straight line segment of each of the first signal lines and the first direction is the preset included angle; and an included angle between the at least one straight line segment of each of the second signal lines and the first direction is the preset included angle.

In an example, the first signal line is one of a gate line and a data line, and the second signal line is the other one of the gate line and the data line.

In an example, the flexible array substrate includes the display region, and at least one straight line segment of each of the signal lines is positioned in the display region.

Another embodiment of the present disclosure provides a flexible display panel, comprising any one of the above described flexible array substrates.

Still another embodiment of the present disclosure provides a display apparatus, comprising any one of the above described flexible display panels.

Still another embodiment of the present disclosure provides a manufacturing method of a flexible array substrate, comprising: forming a plurality of signal lines on a flexible base substrate, wherein the plurality of signal lines include a plurality of first signal lines and a plurality of second signal lines, intersected with each other so as to form a plurality of pixel units arranged in an array; and each of the signal lines has at least one straight line segment, the at least one straight line segment and a first direction form a preset included angle, the first direction is a direction where a long edge of the flexible array substrate is positioned, and the preset included angle is not equal to zero or a right angle.

In an example, the preset included angle meets a formula:

$$\sin \alpha = (x*d1)/(y*d2),$$

where $\alpha$ represents degrees of the preset included angle; d1 represents a line width of the first signal line; d2 represents a line width of the second signal line; x represents a length of a short edge of the flexible array substrate, and y represents a length of the long edge of the flexible array substrate In an example, the flexible array substrate includes a display region, and the preset included angle meets a formula that:

$$\sin \alpha = n * \frac{W}{L} * \frac{(\varepsilon 1 * x * d1 * T2)}{(\varepsilon 2 * y * d2 * T1)},$$

where $\alpha$ represents degrees of the preset included angle; n represents a preset adjustment constant; W represents a length of a short edge of the display region; L represents a length of a long edge of the display region; $\varepsilon 1$ represents a drawing coefficient of a material of the first signal line; $\varepsilon 2$ represents a drawing coefficient of a material of the second signal line; T1 represents a thickness of the first signal line; T2 represents a thickness of the second signal line; d1 represents a line width of the first signal line; d2 represents a line width of the second signal line; and x represents a length of a short edge of the flexible array substrate, and y represents a length of the long edge of the flexible array substrate.

In an example, the plurality of signal lines includes sawtooth-shaped signal lines, and the method further includes: forming a stress relief member at a bent position of the sawtooth-shaped signal line.

In an example, the flexible array substrate includes the display region, and at least one straight line segment of each of the signal lines is positioned in the display region.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

In order to clearly illustrate the technical solution of the embodiments of the disclosure, the drawings of the embodiments or description will be briefly described in the following. It is obvious that the described drawings are only related to some embodiments of the disclosure, and those skilled in the art also can obtain other drawings, without any inventive work, according to the drawings.

FIG. 2-1 is a structural schematic diagram of a flexible array substrate provided by an embodiment of the present disclosure;

FIG. 2-2a is a state schematic diagram of the flexible array substrate provided by the embodiment of the present disclosure which is bent along a first direction;

FIG. 2-2b is a state schematic diagram of the flexible array substrate provided by the embodiment of the present disclosure which is bent along a second direction;

FIG. 2-3 is a force analysis chart in a case that a signal line provided by the embodiment of the present disclosure is a sawtooth-shaped signal line;

FIG. 3-1 is a structural schematic diagram of a flexible array panel provided in a related art;

FIG. 3-2 is a sectional schematic diagram of a film structure of the flexible array panel provided by a related art;

FIG. 3-3 is a schematic diagram of a film structure of another flexible array panel provided by a related art;

FIG. 5-1 is a structural schematic diagram of another flexible array substrate provided by an embodiment of the present disclosure;

FIG. 5-1a is a structural schematic diagram of first signal lines on the another flexible array substrate provided by the embodiment of the present disclosure;

FIG. 5-1b is a structural schematic diagram of second signal lines on the another flexible array substrate provided by the embodiment of the present disclosure;

FIG. 5-2 is a structural schematic diagram of yet another flexible array substrate provided by an embodiment of the present disclosure;

FIG. 5-2a is a structural schematic diagram of first signal lines on the yet another flexible array substrate provided by the embodiment of the present disclosure;

FIG. 5-2b is a structural schematic diagram of second signal lines on the yet another flexible array substrate provided by the embodiment of the present disclosure;

FIG. 5-3 is a structural schematic diagram of still a further flexible array substrate provided by an embodiment of the present disclosure;

FIG. 6-1 is a structural schematic diagram of a flexible display panel provided by an embodiment of the present disclosure;

FIG. 6-2 is a structural schematic diagram of another flexible display panel provided by an embodiment of the present disclosure;

FIG. 6-3 is a structural schematic diagram of yet another flexible display panel provided by an embodiment of the present disclosure;

FIG. 6-4 is a structural schematic diagram of still a further flexible display panel provided by an embodiment of the present disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
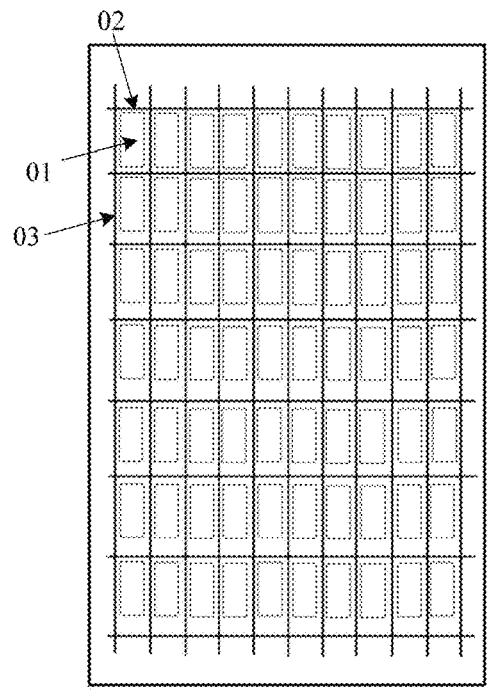
FIG. 1 is a structural schematic diagram of a conventional flexible display panel.
Figures 1, 2:
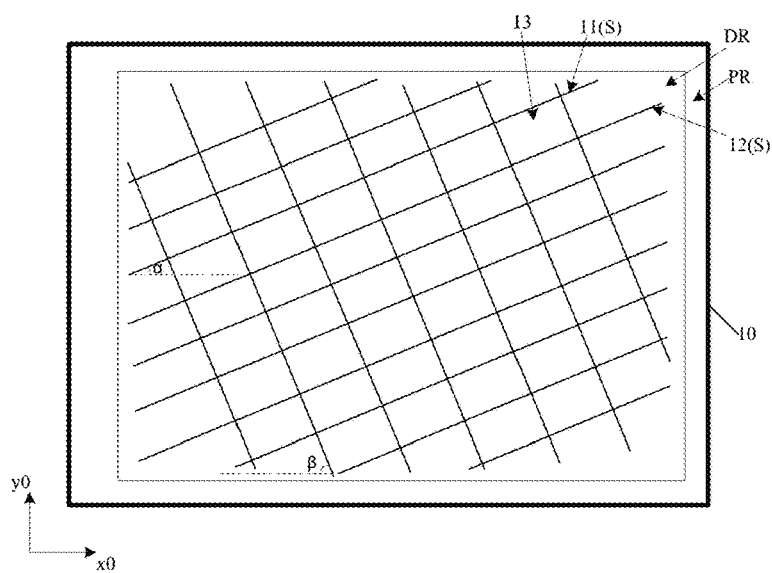

An embodiment of the present disclosure provides a flexible array substrate. As shown in FIG. 2-1, FIG. 2-1 is a structural schematic diagram of the flexible array substrate provided by the present disclosure. The flexible array substrate can include: a flexible base substrate 10. A plurality of signal lines are arranged on the flexible base substrate 10, and the plurality of signal lines define a plurality of pixel regions 13 arranged in an array on the flexible base substrate 10. In the embodiment of the present disclosure, the pixel region 13 can be a closed region or can also be a non-closed region, when being viewed from the top; for example, the pixel region 13 in FIG. 2-1 is the closed region; each pixel region 13 corresponds to one sub pixel of a flexible display panel including the flexible array substrate; each sub pixel can emit light of one color, a projection of each sub pixel of the flexible display panel on the flexible base substrate 10 is positioned in one pixel region 13, and for example, when the flexible display panel is a FLCD display panel, each sub pixel can include: a Thin Film Transistor (TFT), a pixel electrode (which is generally connected with a drain electrode of the TFT), a liquid crystal layer, a common electrode and a color filter (which is used for carrying out color filtration on light to form one color of light); and then in the flexible array substrate provided by the embodiment of the present disclosure, the TFT and the pixel electrode in the sub pixel are formed in the pixel region 13. The flexible array substrate 10 includes a display region DR. The plurality of pixel regions 13 are all positioned in the display region DR.

The plurality of signal lines include: a plurality of first signal lines 11 and a plurality of second signal lines 12, and the first signal line 11 and the second signal line 12 can be positioned on different layers.

Wherein, the signal lines in the plurality of signal lines can be all straight-line-shaped signal lines, and an included angle between any one straight line segment S of each signal line and a first direction (i.e., a direction where an x0 axis in FIG. 2-1 is positioned) is a preset included angle α or a complementary angle β of the preset included angle. Optionally, the preset included angle α is an acute angle. FIG. 2-1 carries out illumination by taking a case that the plurality of signal lines are all straight-line-shaped signal lines as an example, and for example, the signal lines in the plurality of signal lines can be all sawtooth-shaped signal lines, or a part of the plurality of signal lines can be straight-line-shaped signal lines and a part of the plurality of signal lines can be sawtooth-shaped signal lines.

Figures 2, 2A:
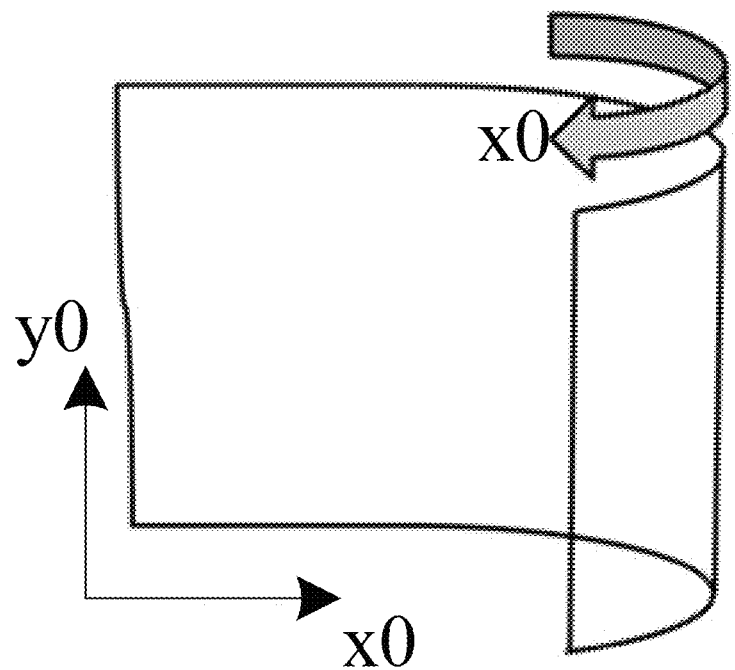
Figures 2, 2B:
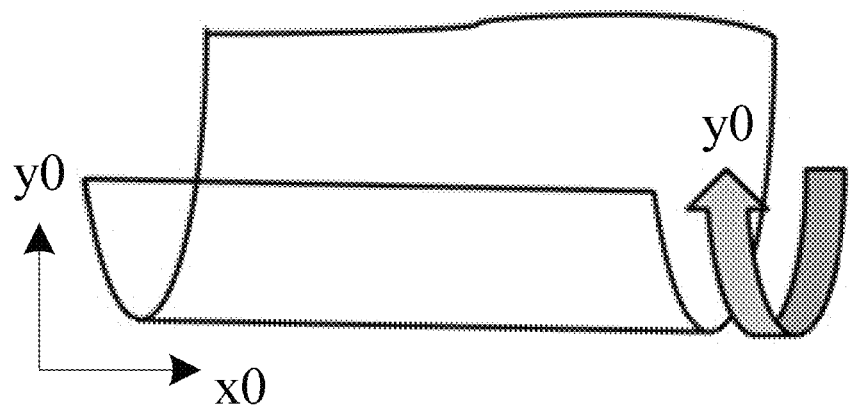

In the embodiment of the present disclosure, the first direction is a direction where a long edge of the flexible array substrate is positioned, a second direction (i.e., a direction where a y0 axis in FIG. 2-1 is positioned) is a direction where a short edge of the flexible array substrate is positioned. With reference to FIG. 2-2a and FIG. 2-2b, FIG. 2-2a is a state schematic diagram of the flexible array substrate provided by the embodiment of the present disclosure which is bent along the first direction, FIG. 2-2b is a state schematic diagram of the flexible array substrate provided by the embodiment of the present disclosure which is bent along the second direction. Generally, when the flexible array substrate is bent, the direction where the long edge of the flexible array substrate is positioned is a primary bending direction and the direction where the short edge of the flexible array substrate is positioned is a secondary bending direction, i.e., a probability of bending along the direction where the long edge of the flexible array substrate is positioned is greater than that of bending along the direction where the short edge of the flexible array substrate is positioned.

Figures 2, 3:
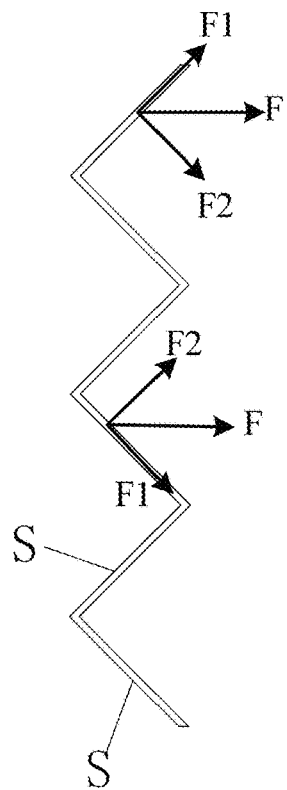
Figures 1, 3:
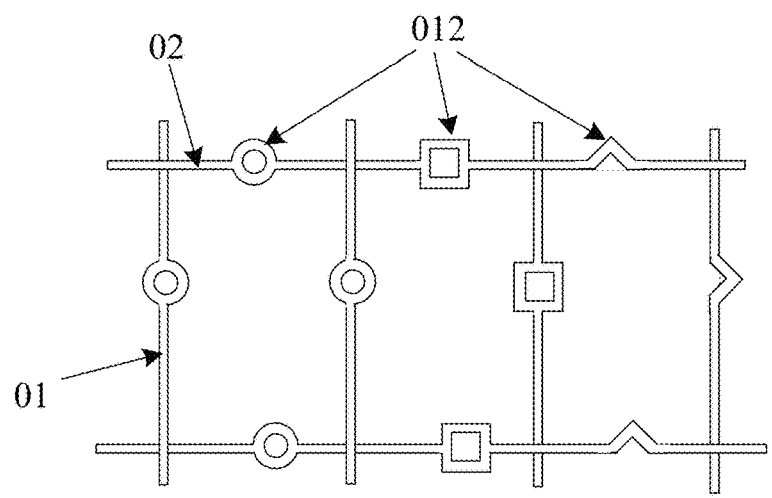
Figures 2, 3:
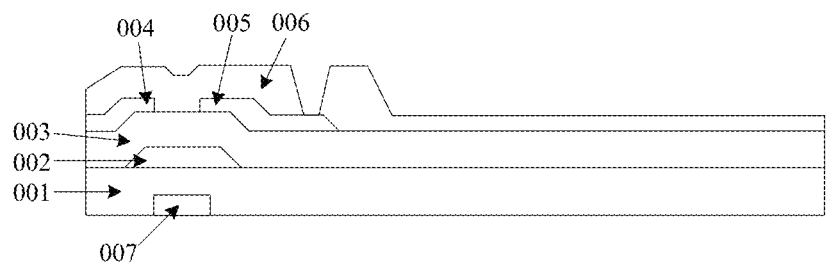
Figure 3:
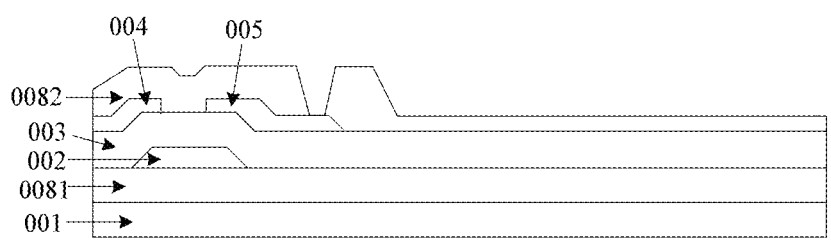

With reference to FIG. 2-3, FIG. 2-3 is a force analysis chart when the signal line provided by the embodiment of the present disclosure is a sawtooth-shaped signal line. The signal line includes a plurality of straight line segments S, and when the signal line is bent, a bending stress F borne by each straight line segment S in the signal line can be decomposed into F1 along a direction where the corresponding straight line segment is positioned and F2 perpendicularly to the direction of the corresponding straight line segment.

For example, when the signal line is the straight-line-shaped signal line, the signal line can be regarded as one straight line segment, and when the signal line is bent, a bending stress borne by the signal line can be decomposed along a direction where the signal line is positioned and along a direction perpendicularly to the direction where the signal line is positioned. Force analysis of the signal line can refer to force analysis of one straight line segment in FIG. 2-3.

From the above, according to the flexible array substrate provided by the embodiment of the present disclosure, by forming two types of signal lines on the flexible base substrate and enabling the included angle between any one straight line segment in each type of signal lines and the first direction to be the preset included angle or the complementary angle of the preset included angle, when the flexible array substrate is bent, a force borne by any one straight line segment in each signal line can be decomposed along the direction where the straight line segment is positioned and a direction perpendicular to the straight line segment, so that the signal line can bear a large bending stress and a breakage probability of the signal line is reduced, thereby reducing a probability of line disconnection defect of the flexible display panel.

Optionally, as shown in FIG. 2-1, the first signal line 11 can be a gate line, and the second signal line 12 can be a data line; or, the first signal line 11 is the data line, and the second signal line 12 is the gate line. The embodiment below carry out illustration by taking a case that the first signal line 11 is the data line and the second signal line 12 is the gate line as an example.

Optionally, the case that the included angle between any one straight line segment in each signal line and the first direction is the preset included angle has various implementation modes. In one implementation mode, the preset included angle meets a first included angle calculation formula, and the first included angle calculation formula is that:

$$\sin \alpha = (x*d1)/(y*d2),$$

Where α represents degrees of the preset included angle; d1 represents a line width of the first signal line; d2 represents a line width of the second signal line; and x represents a short edge length of the flexible array substrate, and y represents a long edge length of the flexible array substrate. When the preset included angle meets the first included angle calculation formula, if the flexible array substrate is bent, two types of signal lines can bear a relatively large bending stress, and a probability of breaking the signal line is relatively low.

In another implementation mode, the preset included angle meets a second included angle calculation formula, and the second included angle calculation formula is that:

$$\sin\alpha = n * \frac{W}{L} * \frac{(\varepsilon 1 * x * d1 * T2)}{(\varepsilon 2 * y * d2 * T1)},$$

Where α represents degrees of the preset included angle; n represents a preset adjustment constant; W represents a short edge length of the display region; L represents a long edge length of the display region; ε1 represents a drawing coefficient of material of the first signal line; ε2 represents a drawing coefficient of material of the second signal line; T1 represents a thickness of the first signal line in a direction perpendicular to the base substrate; T2 represents a thickness of the second signal line in the direction perpendicular to the base substrate; d1 represents the line width of the first signal line; d2 represents the line width of the second signal line; and x represents the short edge length of the flexible array substrate, and y represents the long edge length of the flexible array substrate. When the preset included angle meets the formula, if the flexible array substrate is bent, such two signal lines can bear a larger bending stress.

Exemplarily, the flexible base substrate includes the display region DR (also called as a visual region) and a non-display region PR (also called as a peripheral circuit region), W and L respectively represent the short edge length and the long edge length of the display region, and generally, W:L=9:16 or W:L=3:4; and x and y respectively represent the short edge length and the long edge length of an integral region formed by the display region and the non-display region, i.e., x and y respectively represent the short edge and long edge lengths of the flexible array substrate. ε1 and ε2 represent the drawing coefficient of materials of the two types of signal lines, and due to cases that source and drain electrodes on the flexible base substrate are different from a gate electrode in material and generally, the source and drain electrodes are the same with the first signal line in material and the gate electrode is the same with the second signal line in material, the first signal line and the second signal line are different in drawing coefficient of material, i.e., values of ε1 and ε2 are different; generally, when the materials of the two types of signal lines are determined, the values of the ε1 and the ε2 can be determined. T1 and T2 represent the thicknesses of the two types of signal lines in the direction perpendicular to the base substrate, d1 and d2 represent the widths of two types of signal lines; due to a case that the signal lines are different in thickness and width, when the flexible array substrate is bent, bending resistance of the two types of signal lines is also different.

For example, the preset adjustment constant n generally is an empirical value obtained by prediction and can be a value greater than 0 and smaller than or equal to 1, i.e., 0<n≤1, obtaining of the preset adjustment constant n can have various implementation modes, and the embodiment of the present disclosure carries out illustration by taking several aspects below as examples:

In the first aspect, the preset adjustment constant n can be a ratio of a predicted bending probability of the flexible array substrate along the second direction to a predicted bending probability along the first direction; exemplarily, when a target flexible array substrate is designed, a plurality of flexible array substrate samples can be provided; a plurality of display apparatus respectively made of the plurality of flexible array substrate samples are used by a plurality of users respectively; total times of bending the plurality of display apparatus along the first direction and total times of bending the plurality of display apparatus along the second direction in a preset time period are recorded, a sum of the total times of bending along the first direction and the total times of bending along the second direction is used as a total bending number, then a ratio of the total times of bending along the first direction to the total bending number is used as the predicted bending probability of the flexible array substrate along the first direction, a ratio of the total times of bending along the second direction to the total bending number is used as the predicted bending probability of the flexible array substrate along the second direction, and then the ratio of the bending probability along the second direction to the bending probability along the first direction is determined as the adjustment constant n. For example, by calculation, the bending probability along the first direction is 60%, the bending probability along the second direction is 40%, and at the moment, n=40%÷60%=0.67.

It should be noted that the preset flexible array substrate samples are the same with the target flexible array substrate in size and application, wherein the application of the target flexible array substrate means what kind of device the target flexible array substrate is used in, and for example, the target flexible array substrate is used in a mobile phone or a notebook computer.

In the second aspect, the preset adjustment constant n can be a ratio of predicted limiting bending times of the flexible array substrate along the second direction to predicted limiting bending times along the first direction; the limiting bending times are bending upper limit times of the flexible array substrate, i.e., when bending times exceed the upper limit times, the flexible array substrate will have a fault and generally, the signal line will be broken; exemplarily, when the target flexible array substrate is designed, a plurality of preset flexible array substrate samples can be provided, the plurality of preset flexible array substrate samples are subjected to a bending experiment, bending times when each flexible array substrate sample is bent along the first direction until a signal line of the flexible array substrate sample is broken are calculated out, times obtained by subtracting 1 from the bending times are determined as limiting bending times; an average value of a plurality of obtained limiting bending times along the first direction is obtained, the average value is the predicted limiting bending times of the flexible array substrate along the first direction, and similarly, the predicted limiting bending times of the flexible array substrate along the second direction can also be obtained, so that the preset adjustment constant n can be obtained.

In the third aspect, the preset adjustment constant n can be obtained by simulation of computer software; exemplarily, a plurality of values can be set and taken into the second included angle calculation formula to calculate out the preset included angle, then stress conditions of the signal lines corresponding to various preset included angles are analyzed by the computer software; a corresponding value when bending resistance of the signal line is the highest is obtained, and the value is the preset adjustment constant n.

In the embodiment of the present disclosure, for the flexible array substrates with the same specification, generally, values of α, n, W/L and x/y are the same, while materials, thicknesses or widths of the two types of signal lines can be flexibly modified, so that the two types of signal lines meet process requirements in different cases. Exemplarily, the embodiments of the present disclosure carry out schematic illustration by three cases below:

A first case: if the widths of the two types of signal lines do not meet the process requirements, a value of d1/d2 is modified, and meanwhile, a value of T1/T2 or ε1/ε2 is reversely deduced out according to the second included angle calculation formula so as to redesign the thicknesses or the materials of two types of signal lines to enable the widths of the two types of signal lines to meet the process requirements.

A second case: if the drawing coefficient of materials of two types of signal lines need to be increased, the bending resistance of the two types of signal lines is also correspondingly improved, and in a case of not redesigning a mask (i.e., the widths d1 and d2 of the two types of signal lines are not modified), a ratio of T1 to T2 is reversely deduced out according to the second included angle calculation formula, so that the thicknesses of two types of signal lines can be redesigned.

A third case: if a capacitance and a resistance in the flexible base substrate need to be changed, the thicknesses of two types of signal lines can be reduced, and in a case of not changing the materials of two types of signal lines, the value of d1/d2 is reversely deduced out according to the second included angle calculation formula so as to reduce the widths of the two types of signal lines so as to achieve an effect of changing the capacitance and the resistance in the flexible base substrate.

Reference is made to FIG. 3-1, FIG. 3-2 and FIG. 3-3 which show processing methods for flexible array substrates provided in the related art to prevent breakage of a signal line. In FIG. 3-1, breakage preventing structures 012 are added to gate lines 01 and data lines 02. However, the breakage preventing structures 012 may occupy a space of a pixel region so as to cause reduction of transmittance of a flexible display panel. Both the flexible array substrates in FIG. 3-2 and FIG. 3-3 include a glass substrate 001, a gate electrode 002, a gate insulating layer 003, a source electrode 004 and a drain electrode 005, the flexible array substrate in FIG. 3-2 further includes a passivation layer 006 and a protrusion structure 007, and a protrusion structure 03 is added, but the protrusion structure 03 requires an additional manufacturing process, so that the process complex degree of manufacturing the flexible array substrate and manufacturing cost are increased. In FIG. 3-3, a first stress absorption layer 0081 is added below the gate electrode 002, a second stress absorption layer 0082 is added above the source electrode 004 and the drain electrode 005, so that similarly, the process complex degree of manufacturing the flexible array substrate and manufacturing cost are also increased, and meanwhile, when an additional film layer structure is added, a thickness of the flexible display panel will be increased and it is easy to cause falling of a film layer.

In the flexible array substrate provided by the embodiment of the present disclosure, the included angle between the first direction and any one straight line segment or each straight line segment in each of the two types of signal lines on the flexible array substrate is the preset included angle or the complementary angle of the preset included angle, and the two types of signal lines may not occupy the space of the pixel region, and thus, transmittance of the flexible display panel may not be influenced; meanwhile, the two types of signal lines are relatively simple in manufacturing process and do not require an additional manufacturing process, and thus, the thickness and manufacturing cost of the flexible display panel may not be increased.

Figure 4:
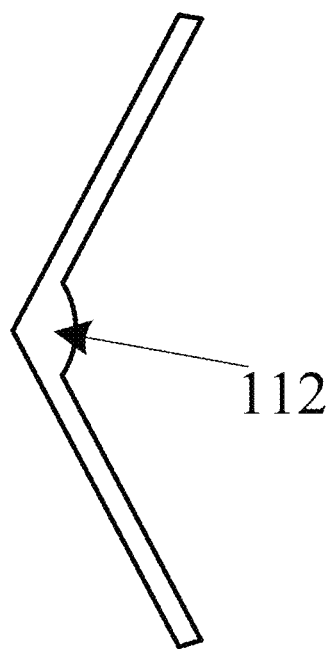
FIG. 4 is a structural schematic diagram of a bent position of a sawtooth-shaped signal line provided by an embodiment of the present disclosure.

In an embodiment of the present disclosure, when any one signal line in the plurality of signal lines is a sawtooth-shaped signal line, with reference to FIG. 4 which is a structural schematic diagram of one bent position in the sawtooth-shaped signal line provided by the embodiment of the present disclosure, a stress relief member 112 is arranged at a bent position of each sawtooth-shaped signal line, the stress relief member 112 can be a sector structure, the sector structure is arranged inside the bent position, a central angle of the sector structure is equal to a bending angle of the bent position and the central angle is an acute angle. When the signal line is the sawtooth-shaped signal line, the stress relief member is arranged at the bent position, so that when the flexible array substrate is bent, a probability of generating breakage due to a relatively large stress at the bent position can be effectively reduced.

In the embodiment of the present disclosure, the stress relief member 112 can be made of the same material with the corresponding data line; when the sawtooth-shaped signal line is formed, the stress relief member is formed, i.e., the sawtooth-shaped signal line and the stress relief member are simultaneously formed by one patterning process. For example, the stress relief member 112 can also be made of a different material from the data line and adopts a material with elasticity, and in this case, the sawtooth-shaped signal line and the stress relief member 112 are formed at least by executing two patterning processes.

In the embodiment of the present disclosure, based on different shapes of the first signal line and the second signal line in the flexible base substrate, the embodiment of the present disclosure carries out schematic illustration by four implementable modes below:

In the first aspect, as show in FIG. 2-1, the pixel region 13 is a rectangular region, the pixel region 13 is a closed region, both the first signal line 11 and the second signal line 12 are straight-line-shaped signal lines, a plurality of first signal lines 11 are arranged in parallel, and a plurality of second signal lines 12 are arranged in parallel, wherein the included angle between the first signal line 11 and the first direction is the preset included angle α, and the included angle between the second signal line 12 and the first direction is a complementary angle β of the preset included angle.

Figures 1, 5:
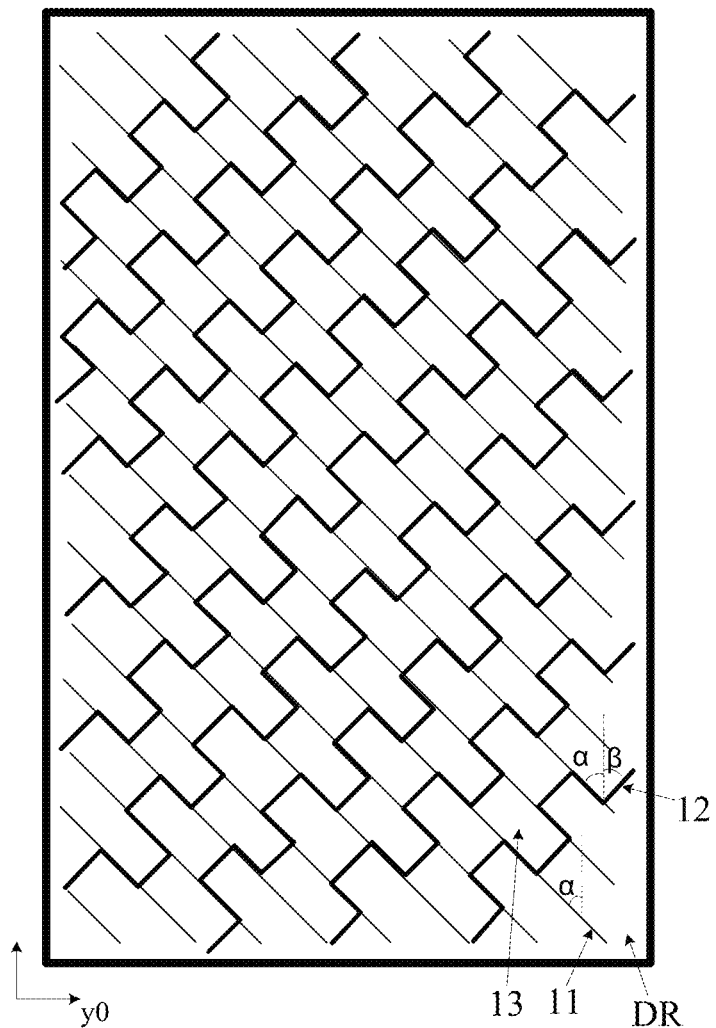
Figures 1A, 5:
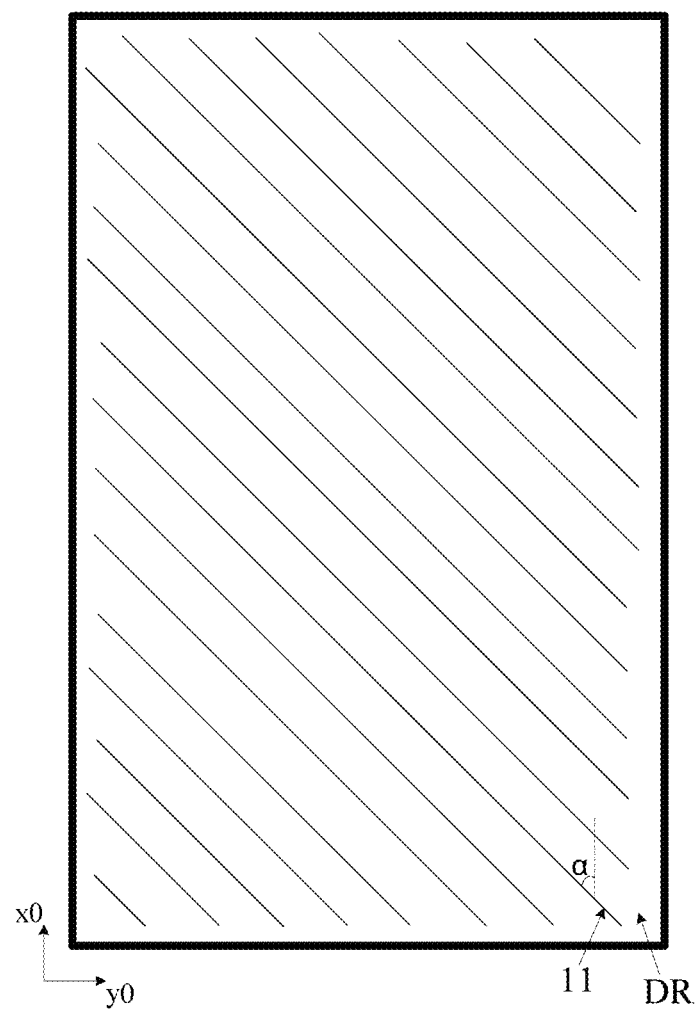
Figures 1B, 5:
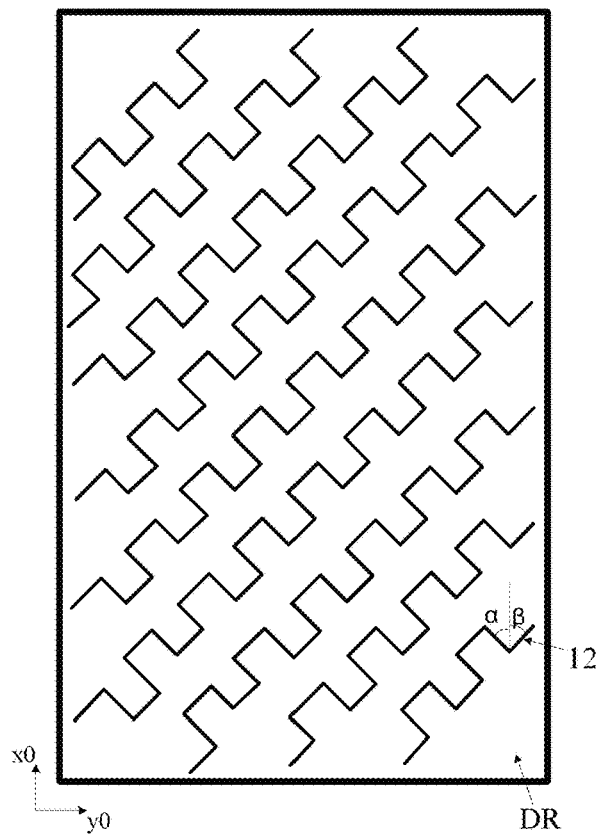
Figures 2, 5:
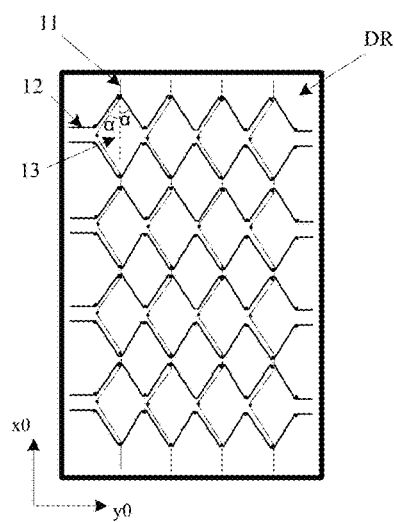
Figures 2A, 5:
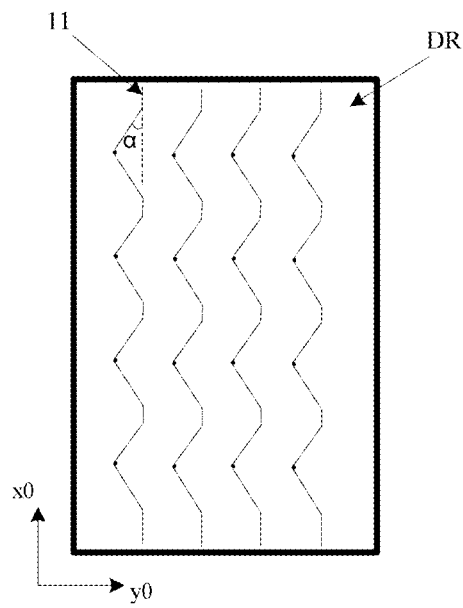
Figures 2B, 5:
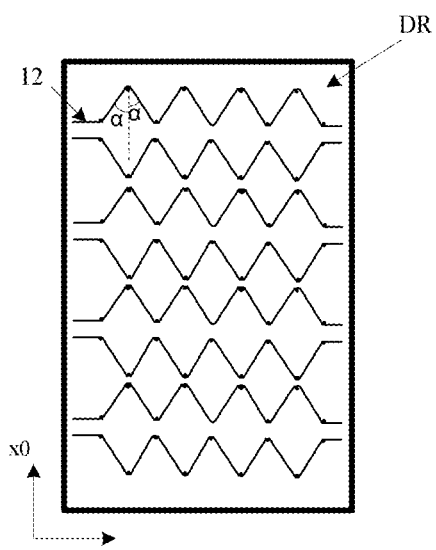
Figures 3, 5:
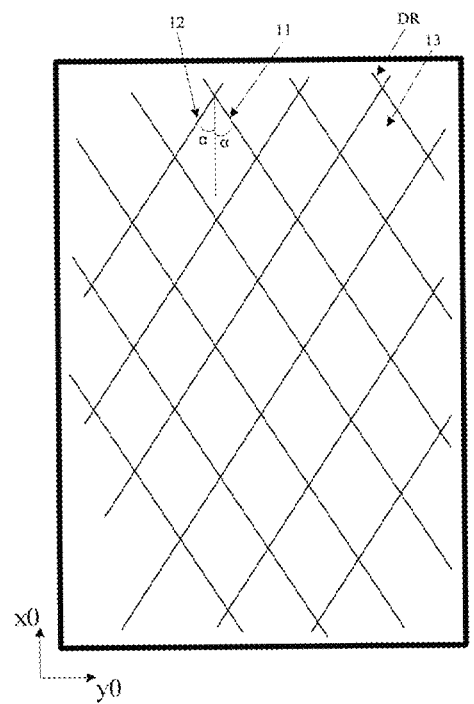

In the second aspect, with reference to FIG. 5-1 which is a structural schematic diagram of another flexible array substrate provided by an embodiment of the present disclosure, a pixel region 13 is a rectangular region, the pixel region 13 is a closed region, the first signal line 11 are straight-line-shaped signal lines, and the plurality of first signal lines 11 are arranged in parallel; and the second signal lines 12 are square-wave-shaped signal lines with rectangular protrusions; an included angle between one of any two adjacent straight line segments in the second signal line 12 and a first direction (i.e., a direction where an x0 axis in FIG. 5-1 is positioned) is a preset included angle α, and an included angle between the other straight line segment and the first direction is a complementary angle β of the preset included angle. In order to show the first signal line 11 and the second signal line 12 on a flexible base substrate 10 in FIG. 5-1 more clearly, the embodiment of the present disclosure provides renderings of two types of signal lines on the flexible base substrate 10 in FIG. 5-1, with reference to FIG. 5-1a and FIG. 5-2b, in FIG. 5-1a, the first signal line 11 is the straight-line-shaped signal line, and in FIG. 5-1b, the second signal line 12 is the square-wave-shaped signal line with the rectangular protrusion.

In the third aspect, with reference to FIG. 5-2 which is a structural schematic diagram of yet another flexible array substrate provided by an embodiment of the present disclosure, a pixel region 13 is a diamond-shaped region, the pixel region 13 is a non-closed region, and the first signal line 11 are sawtooth-shaped signal lines with isosceles triangular protrusions; and the second signal line 12 are also sawtooth-shaped signal lines with isosceles triangular protrusions, and the included angle α between each of the first signal line 11 and the second signal line 12 and a first direction (i.e., a direction where an x0 axis in FIG. 5-2 is positioned) are equal to a preset included angle. In FIG. 5-2, projections of the first signal line 11 and the second signal line 12 on the flexible base substrate 10 are not overlapped; for example, orthogonal projections of the first signal line 11 and the second signal line 12 on the flexible base substrate 10 can also be overlapped. In order to show the first signal line 11 and the second signal line 12 on the flexible base substrate 10 in FIG. 5-2 more clearly, the embodiment of the present disclosure provides renderings of two types of signal lines in FIG. 5-2 on the flexible base substrate 10, with reference to FIG. 5-2a and FIG. 5-2b, in FIG. 5-2a, the first signal line 11 is the sawtooth-shaped signal line with the isosceles triangular protrusion, and in FIG. 5-2b, the second signal line 12 is also the sawtooth-shaped signal line with the isosceles triangular protrusion.

In the four aspect, with reference to FIG. 5-3 which is a structural schematic diagram of still a further flexible array substrate provided by an embodiment of the present disclosure, a pixel region 13 is a diamond-shaped region, the pixel region 13 is a non-closed region, both the first signal lines 11 and the second signal lines 12 are straight-line-shaped signal lines; the plurality of first signal lines 11 are arranged in parallel, and the plurality of second signal lines 12 are arranged in parallel, wherein included angle between each of the first signal line 11 and the second signal line 12 and a first direction (i.e., a direction where an x0 axis in FIG. 5-3 is positioned) are equal to a preset included angle α.

In the embodiments of the present disclosure, the first signal line and the second signal line can also adopt other arranging modes, as long as the included angle between any one straight line segment in each signal line and the first direction can be guaranteed to be the preset included angle or the complementary angle of the preset included angel.

The embodiments above are in a case that the pixel region is the rectangular region or the diamond-shaped region, for example, the pixel region on the flexible base substrate can also be of other shapes, for example, the pixel region is a regular hexagonal region, at the moment, both the first signal line and the second signal line can be straight-line-shaped signal lines, a plurality of first signal lines are arranged in parallel, a plurality of second signal lines are arranged in parallel, and both the included angles between the first signal line and the second signal line and the first direction are the preset included angle. The embodiments of the present disclosure do not limit the shape of the pixel region of the flexible base substrate.

Those skilled in the art can clearly know that in order to conveniently and simply describe, a manufacturing process of the described flexible base substrate can refer to a corresponding process in a method embodiment below and is not repeated herein.

From the above, according to the flexible array substrate provided by the embodiments of the present disclosure, by forming two types of signal lines on the flexible base substrate and enabling the included angle between any one straight line segment in each type of signal lines and the first direction to be the preset included angle or the complementary angle of the preset included angle, when the flexible array substrate is bent, a force borne by any one straight line segment in each signal line can be decomposed along the direction where the straight line segment is positioned and a direction perpendicular to the straight line segment, so that the signal line can bear a large bending stress and a breakage probability of the signal line is reduced, thereby reducing a probability of line disconnection defect of the flexible display panel. Meanwhile, two types of signal lines may not occupy the space of the pixel region, the two types of signal lines are relatively simple in manufacturing process and do not require an additional manufacturing process, and thus, transmittance of the display panel may not be influenced and the thickness and manufacturing cost of the display panel may not be increased.

An embodiment of the present disclosure further provides a flexible display panel, which includes: any one of the above-mentioned flexible array substrates and a plurality of sub pixels arranged in a plurality of pixel regions on the flexible array substrate, the plurality of sub pixels corresponding to the pixel regions one to one.

Optionally, the flexible display panel is a FOLED display panel, a FEPD display panel or a FLCD display panel.

Figures 1, 6:
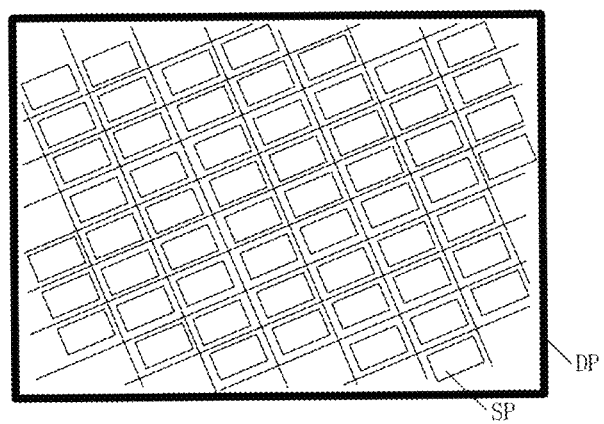
Figures 2, 6:
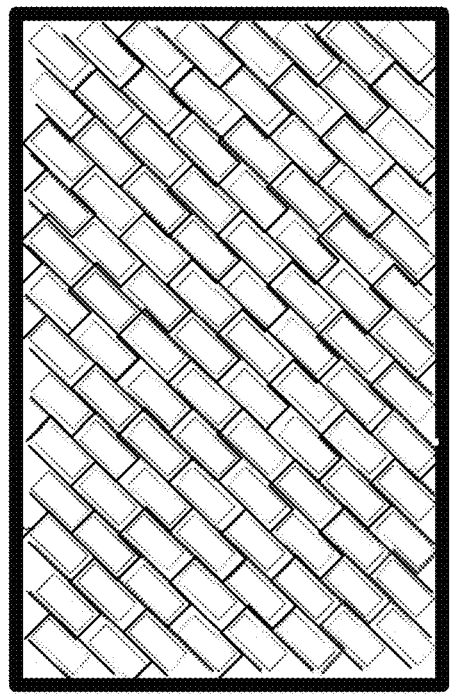
Figures 3, 6:
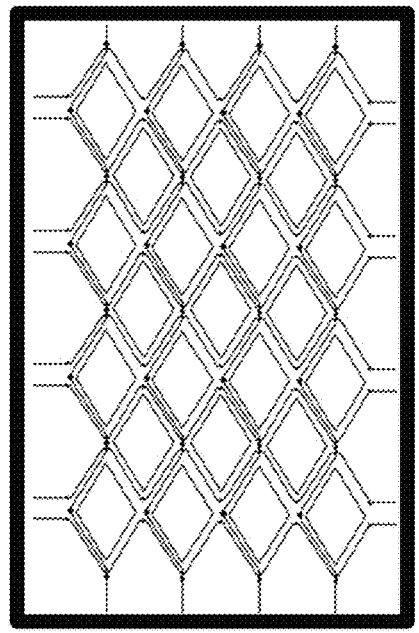
Figures 4, 6:
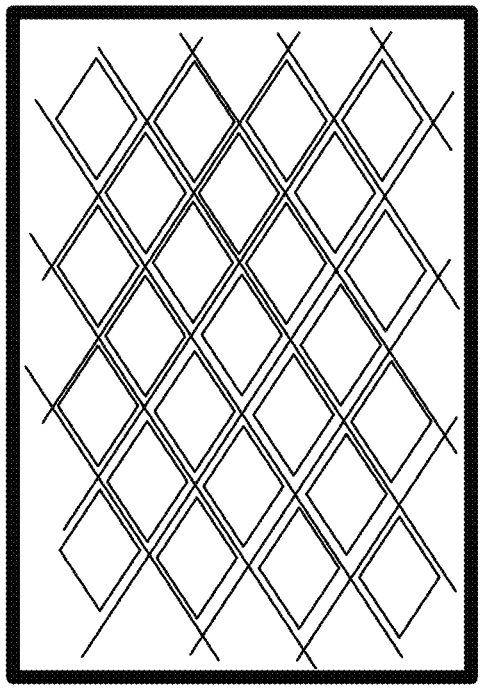

Exemplarily, when the flexible display panel DP is the FLCD display panel, the flexible display panel DP includes sub pixels SP arranged in an array; when the pixel regions on the flexible array substrate are different in shape, shapes of the sub pixels can be correspondingly regulated, and the flexible display panel can be any one of flexible display panels in FIG. 6-1 to FIG. 6-4. With reference to FIG. 6-1, FIG. 6-2, FIG. 6-3 and FIG. 6-4, in FIG. 6-1 and FIG. 6-2, the sub pixel is positioned in a rectangular region formed by the surrounding of the two types of signal lines, and the sub pixels SP are of a rectangular shape; and in FIG. 6-3 and FIG. 6-4, the sub pixel is positioned in a diamond-shaped region formed by the surrounding of the two types of signal lines, and the sub pixels are of a diamond-shaped region. The flexible display panel can also include a color filter substrate, and color filters on the color filter substrate are correspondingly the same with the pixel regions on the flexible array substrate in shape and area.

An embodiment of the present disclosure further provides a manufacturing method of a flexible array substrate. The method can include:

Forming a plurality of signal lines on a flexible base substrate, the plurality of signal lines define a plurality of pixel regions arranged in an array on the flexible base substrate.

Wherein the plurality of signal lines include: a plurality of first signal lines and a plurality of second signal lines, and the first signal line and the second signal line are positioned on different layers; and the signal lines in the plurality of signal lines are straight-line-shaped signal lines and/or sawtooth-shaped signal lines, an included angle between any one straight line segment in each signal line and a first direction is a preset included angle or a complementary angle of the preset included angle, and the first direction is a direction where a long edge of the flexible array substrate is positioned.

From the above, according to the manufacturing method of the flexible array substrate, which is provided by the embodiment of the present disclosure, by forming two types of signal lines on the flexible base substrate and enabling the included angle between any one straight line segment in each type of signal lines and the first direction to be the preset included angle or the complementary angle of the preset included angle, when the flexible array substrate is bent, a force borne by any one straight line segment in each signal line can be decomposed along the direction where the straight line segment is positioned and the direction perpendicular to the straight line segment, so that the signal line can bear a large bending stress and a breakage probability of the signal line is reduced, thereby reducing a probability of line disconnection defect of a flexible display panel.

Figure 7:
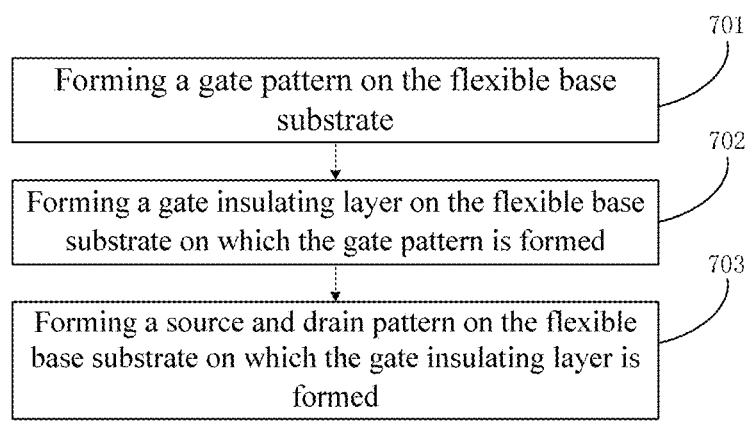
FIG. 7 is a flow chart of a manufacturing method of a flexible array substrate, which is provided by an embodiment of the present disclosure.

The embodiment of the present disclosure carries out illustration by taking a case that the first signal line is a data line and the second signal line is a gate line as an example. As shown in FIG. 7, FIG. 7 is a flow chart of the manufacturing method of the flexible array substrate, which is provided by the embodiment of the present disclosure, and the manufacturing method of a flexible base substrate can include the steps as follows:

S701: forming a gate pattern on the flexible base substrate.

Exemplarily, a gate metal layer is formed on the flexible base substrate in any one of various modes of deposition, coating, sputtering and the like, then the gate metal layer is processed by a one-time patterning process to form the gate pattern, and the one-time patterning process can include: photoresist coating, exposure, development, etching and photoresist stripping, wherein the gate pattern includes the gate lines.

S702: forming a gate insulating layer on the flexible base substrate on which the gate pattern is formed.

Exemplarily, the gate insulating layer is formed on the base substrate on which the gate pattern is formed in any one of various modes of deposition, coating, sputtering and the like.

S703: forming a source and drain pattern on the flexible base substrate on which the gate insulating layer is formed.

Exemplarily, the source and drain film layer is formed on the flexible base substrate on which the gate insulating layer is formed in any one of various modes of deposition, coating, sputtering and the like, then the source and drain film layer is processed by a patterning process to form the source and drain pattern, and the patterning process can include: photoresist coating, exposure, development, etching and photoresist stripping, wherein the source and drain pattern includes the data lines.

Optionally, the preset included angle meets a first included calculation formula, and the first included angle calculation formula is that:

$$\sin \alpha = (x*d1)/(y*d2),$$

Where α represents degrees of the preset included angle; d1 represents a line width of the data line; d2 represents a line width of the gate line; and x represents a short edge length of the flexible array substrate, and y represents a long edge length of the flexible array substrate.

Each of the gate lines and the data lines has at least one straight line segment, the at least one straight line segment and the first direction form the preset included angle, the first direction is the direction where the long edge of the flexible array substrate is positioned, and the preset included angle is not equal to zero or a right angle.

Optionally, the flexible array substrate includes a display region, the preset included angle meets an included angle calculation formula, the second included angle calculation formula is that:

$$\sin \alpha = n * \frac{W}{L} * \frac{(\varepsilon1*x*d1*T2)}{(\varepsilon2*y*d2*T1)},$$

Where α represents degrees of the preset included angle; n represents a preset adjustment constant; W represents a short edge length of the display region; L represents a long edge length of the display region; ε1 represents a drawing coefficient of material of the data line; ε2 represents a drawing coefficient of material of the second signal line; T1 represents a thickness of the data line; T2 represents a thickness of the gate line; d1 represents the line width of the data line; d2 represents the line width of the gate line; and x represents the short edge length of the flexible array substrate, and y represents the long edge length of the flexible array substrate.

Optionally, a stress relief member is arranged at a bent position of each sawtooth-shaped signal line in a plurality of signal lines.

Optionally, the stress relief member is a sector structure, the sector structure is arranged inside the bent position, and a central angle of the sector structure is equal to a bending angle of the bent position.

Optionally, the pixel region is a rectangular region, both the data line and the gate line are straight-line-shaped signal lines, a plurality of data lines are arranged in parallel, and a plurality of gate lines are arranged in parallel, wherein the included angle between the data line 11 and the first direction is the preset included angle, and the included angle between the gate line and the first direction is the complementary angle of the preset included angle.

Optionally, the pixel region is a rectangular region, the data line is a straight-line-shaped signal line, and a plurality of data lines are arranged in parallel; and the gate line is a square-wave-shaped signal line with a rectangular protrusion, an included angle between one of any two adjacent straight line segments in the gate line and the first direction is the preset included angle, and an included angle between the other straight line segment and the first direction is the complementary angle of the preset included angle.

Optionally, the pixel region is a diamond-shaped region, and the data line is a sawtooth-shaped signal line with an isosceles triangular protrusion; and the gate line is also a sawtooth-shaped signal line with an isosceles triangular protrusion, and both included angles between the data line and the gate line and the first direction are equal to the preset included angle.

Those skilled in the art can clearly know that in order to conveniently and simply describe, a principle of the described flexible array substrate can refer to the embodiments of the above-mentioned flexible array substrate structures and is not repeated herein.

From the above, according to the manufacturing method of the flexible array substrate, which is provided by the embodiment of the present disclosure, by forming two types of signal lines on the flexible base substrate and enabling the included angle between any one straight line segment in each type of signal lines and the first direction to be the preset included angle or the complementary angle of the preset included angle, when the flexible array substrate is bent, a force borne by any one straight line segment in each signal line can be decomposed along the direction where the straight line segment is positioned and a direction perpendicular to the straight line segment, so that the signal line can bear a large bending stress and a breakage probability of the signal line is reduced, thereby reducing a probability of line disconnection defect of the flexible display panel. Meanwhile, the two types of signal lines may not occupy the space of the pixel region, and two types of signal lines are relatively simple in manufacturing process and do not require an additional manufacturing process, and thus, transmittance of the display panel may not be influenced, and the thickness and manufacturing cost of the display panel may not be increased.

An embodiment of the present disclosure further provides a display apparatus. The display apparatus includes the above-mentioned flexible display panel. The display apparatus can be: any product or part with a display function, e.g., a liquid crystal panel, electronic paper, a mobile phone, a tablet personal computer, a television, a display, a notebook computer, a digital photo frame, a navigator and the like.

Those skilled in the art can understand that all or part of steps for implementing the above-mentioned embodiments can be completed by hardware and can also be completed by instructing related hardware by a program, the program can be stored in a computer readable memory medium, and the above-mentioned memory medium can be a read only memory, a magnetic disk or a compact disc and the like.

The foregoing embodiments merely are exemplary embodiments of the disclosure, and not intended to limit the disclosure, and the scope of the disclosure is determined by the appended claims. Any modifications, equivalent replacements, improvements and the like in the spirit and principle of the disclosure shall fall within the scope of the disclosure.

The present application claims priority of the Chinese Patent Application No. 201611237973.2 filed on Dec. 28, 2016, the disclosure of which are incorporated herein by its reference in its entirety as part of the present application.

The invention claimed is:

1. A flexible array substrate, comprising:
a flexible base substrate; and
a plurality of signal lines on the flexible base substrate, comprising: a plurality of first signal lines and a plurality of second signal lines, intersected to each other to form a plurality of pixel units arranged in an array,
wherein each of the signal lines has at least one straight line segment, the at least one straight line segment and a first direction form a preset included angle, the first direction is a direction where a long edge of the flexible array substrate is positioned, and the preset included angle is not equal to zero or a right angle,
wherein the preset included angle meets a formula that:

$$\sin \alpha = (x*d1)/(y*d2),$$

where the α represents degrees of the preset included angle; the d1 represent a line width of the first signal line; the d2 represents a line width of the second signal line; and x represents a length of a short edge of the flexible array substrate, and y represents a length of the long edge of the flexible array substrate.

2. The flexible array substrate according to claim 1, wherein a shape of the plurality of signal lines includes at least one of a straight line shape, a square wave shape or a sawtooth shape.

3. The flexible array substrate according to claim 1, wherein the plurality of signal lines include sawtooth-shaped signal lines, and a stress relief member is arranged at a bent position of the sawtooth-shaped signal line.

4. The flexible array substrate according to claim 3, wherein the stress relief member is a sector structure, the sector structure is arranged inside the bent position, and a central angle of the sector structure is equal to a bending angle of the bent position and smaller than 180 degrees.

5. The flexible array substrate according to claim 1, wherein the pixel region is a rectangular region,
both the first signal line and the second signal line are straight-line-shaped signal lines, the plurality of first signal lines are arranged in parallel, and the plurality of second signal lines are arranged in parallel,
wherein an included angle between the first signal line and the first direction is the preset included angle, and an included angle between the second signal line and the first direction is a complementary angle of the preset included angle.

6. The flexible array substrate according to claim 1, wherein the pixel region is a rectangular region,
the first signal line is a straight-line-shaped signal line, and the plurality of first signal lines are arranged in parallel; and
the second signal line is a square-wave-shaped signal line with a rectangular protrusion, and an included between the first direction and one of any two adjacent straight line segments in the second signal line is the preset included angle, and an included angle between the first direction and the other of the any two adjacent straight line segments is a complementary angle of the preset included angle.

7. The flexible array substrate according to claim 1, wherein the pixel region is a diamond-shaped region, and
the first signal line is a sawtooth-shaped signal line with an isosceles triangular protrusion;
the second signal line is a sawtooth-shaped signal line with an isosceles triangular protrusion, and an included between the at least one straight line segment of each of the first signal lines and the first direction is the preset included angle; and an included angle between the at least one straight line segment of each of the second signal lines and the first direction is the preset included angle.

8. The flexible array substrate according to claim 1, wherein
the first signal line is one of a gate line and a data line, and the second signal line is the other one of the gate line and the data line.

9. The flexible array substrate according to claim 1, wherein the flexible array substrate includes the display region, and at least one straight line segment of each of the signal lines is positioned in the display region.

10. A flexible display panel, comprising: the flexible array substrate according to claim 1.

11. A display apparatus, comprising the flexible display panel according to claim 10.

12. A manufacturing method of a flexible array substrate, comprising:
forming a plurality of signal lines on a flexible base substrate, wherein the plurality of signal lines include a plurality of first signal lines and a plurality of second signal lines, intersected with each other so as to form a plurality of pixel units arranged in an array; and
each of the signal lines has at least one straight line segment, the at least one straight line segment and a first direction form a preset included angle, the first direction is a direction where a long edge of the flexible array substrate is positioned, and the preset included angle is not equal to zero or a right angle,
wherein the preset included angle meets a formula:

$$\sin \alpha = (x*d1)/(y*d2),$$

where α represents degrees of the preset included angle; d1 represents a line width of the first signal line; d2 represents a line width of the second signal line; x represents a length of a short edge of the flexible array substrate, and y represents a length of the long edge of the flexible array substrate; or wherein the flexible array substrate includes a display region, and the preset included angle meets a formula that:

$$\sin \alpha = n * \frac{W}{L} * \frac{(\varepsilon 1 * x * d1 * T2)}{(\varepsilon 2 * y * d2 * T1)},$$

where α represents degrees of the preset included angle; n represents a preset adjustment constant; W represents a length of a short edge of the display region; L represents a length of a long edge of the display region; ε1 represents a drawing coefficient of a material of the first signal line; ε2 represents a drawing coefficient of a material of the second signal line; T1 represents a thickness of the first signal line; T2 represents a thickness of the second signal line; d1 represents a line width of the first signal line; d2 represents a line width of the second signal line; and x represents a length of a short edge of the flexible array substrate, and y represents a length of the long edge of the flexible array substrate.

13. The method according to claim 12, wherein the plurality of signal lines includes sawtooth-shaped signal lines, and the method further includes: forming a stress relief member at a bent position of the sawtooth-shaped signal line.

14. The method according to claim 12, wherein the flexible array substrate includes the display region, and at least one straight line segment of each of the signal lines is positioned in the display region.

15. A flexible array substrate, comprising:
a flexible base substrate; and
a plurality of signal lines on the flexible base substrate, comprising: a plurality of first signal lines and a plurality of second signal lines, intersected to each other to form a plurality of pixel units arranged in an array, wherein each of the signal lines has at least one straight line segment, the at least one straight line segment and a first direction form a preset included angle, the first direction is a direction where a long edge of the flexible array substrate is positioned, and the preset included angle is not equal to zero or a right angle,
wherein the flexible array substrate includes a display region, and the preset included angle meets a formula that:

$$\sin \alpha = n * \frac{W}{L} * \frac{(\varepsilon 1 * x * d1 * T2)}{(\varepsilon 2 * y * d2 * T1)},$$

where α represents degrees of the preset included angle; n represents a preset adjustment constant; W represents a length of a short edge of the display region; L represents a length of a long edge of the display region; ε1 represents a drawing coefficient of a material the first signal line; ε2 represents a drawing coefficient a material of the second signal line; T1 represents a thickness of the first signal line; T2 represents a thickness of the second signal line; d1 represents a line width of the first signal line; d2 represents a line width of the second signal line; and x represents a length of a short edge of the flexible array substrate, and y represents a length of the long edge of the flexible array substrate.

16. The flexible array substrate according to claim 15, wherein
the plurality of signal lines include sawtooth-shaped signal lines, and a stress relief member is arranged at a bent position of the sawtooth-shaped signal line.

17. The flexible array substrate according to claim 16, wherein the stress relief member is a sector structure, the sector structure is arranged inside the bent position, and a central angle of the sector structure is equal to a bending angle of the bent position and smaller than 180 degrees.

18. The flexible array substrate according to claim 15, wherein the pixel region is a rectangular region,
both the first signal line and the second signal line are straight-line-shaped signal lines, the plurality of first signal lines are arranged in parallel, and the plurality of second signal lines are arranged in parallel,
wherein an included angle between the first signal line and the first direction is the preset included angle, and an included angle between the second signal line and the first direction is a complementary angle of the preset included angle.

19. The flexible array substrate according to claim 15, wherein the pixel region is a rectangular region,
the first signal line is a straight-line-shaped signal line, and the plurality of first signal lines are arranged in parallel; and
the second signal line is a square-wave-shaped signal line with a rectangular protrusion, and an included between the first direction and one of any two adjacent straight line segments in the second signal line is the preset included angle, and an included angle between the first direction and the other of the any two adjacent straight line segments is a complementary angle of the preset included angle.

20. The flexible array substrate according to claim 15, wherein the pixel region is a diamond-shaped region, and
the first signal line is a sawtooth-shaped signal line with an isosceles triangular protrusion;
the second signal line is a sawtooth-shaped signal line with an isosceles triangular protrusion, and an included between the at least one straight line segment of each of the first signal lines and the first direction is the preset included angle; and an included angle between the at least one straight line segment of each of the second signal lines and the first direction is the preset included angle.

* * * * *